United States Patent
Li et al.

(10) Patent No.: US 10,553,820 B2
(45) Date of Patent: Feb. 4, 2020

(54) ENCAPSULATION METHOD AND STRUCTURE OF ORGANIC LIGHT EMITTING DIODE

(71) Applicants: BOE Technology Group Co., Ltd., Beijing (CN); HEFEI BOE Optoelectronics Technology Co., Ltd., Hefei (CN)

(72) Inventors: Yajun Li, Beijing (CN); Jun Zhang, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/125,489

(22) PCT Filed: Sep. 21, 2015

(86) PCT No.: PCT/CN2015/090100
§ 371 (c)(1),
(2) Date: Sep. 12, 2016

(87) PCT Pub. No.: WO2016/192246
PCT Pub. Date: Dec. 8, 2016

(65) Prior Publication Data
US 2017/0179428 A1    Jun. 22, 2017

(30) Foreign Application Priority Data
Jun. 3, 2015   (CN) .......................... 2015 1 0299124

(51) Int. Cl.
*H01L 51/52*   (2006.01)
*H01L 51/56*   (2006.01)

(52) U.S. Cl.
CPC .......... *H01L 51/5253* (2013.01); *H01L 51/56* (2013.01); *H01L 2251/301* (2013.01); *H01L 2251/558* (2013.01)

(58) Field of Classification Search
CPC ........................... H01L 51/5253; H01L 51/56
See application file for complete search history.

(56) References Cited

U.S. PATENT DOCUMENTS

2004/0119402 A1   6/2004   Shiang et al.
2012/0326194 A1   12/2012  Son et al.
(Continued)

FOREIGN PATENT DOCUMENTS

CN   1508890 A    6/2004
CN   101730949 A  6/2010
(Continued)

OTHER PUBLICATIONS

Apr. 14, 2017—(CN) Third Office Action Appn 201510299124.9 with English Tran.
(Continued)

*Primary Examiner* — Ori Nadav
*Assistant Examiner* — Vernon P Webb
(74) *Attorney, Agent, or Firm* — Banner & Witcoff, Ltd.

(57) ABSTRACT

An encapsulation method and encapsulation structure of an organic light emitting diode (OLED) are provided. The method includes: preparing an OLED substrate, the OLED substrate comprises a base substrate and at least one OLED device formed on the base substrate; forming a first encapsulation layer at a side of the OLED substrate formed with the OLED device to cover the OLED device; and forming a second encapsulation layer on the first encapsulation layer, the second encapsulation layer is a metal layer.

6 Claims, 1 Drawing Sheet

(56) References Cited

U.S. PATENT DOCUMENTS

| | | | |
|---|---|---|---|
| 2013/0026503 A1* | 1/2013 | Son | H01L 51/5243 |
| | | | 257/88 |
| 2014/0374704 A1 | 12/2014 | Jang et al. | |
| 2016/0064628 A1 | 3/2016 | Fujii et al. | |
| 2016/0093576 A1* | 3/2016 | Chiu | H01L 21/4853 |
| | | | 257/659 |

FOREIGN PATENT DOCUMENTS

| | | | |
|---|---|---|---|
| CN | 102299265 A | 12/2011 | |
| CN | 102449797 A | 5/2012 | |
| CN | 102640564 A | 8/2012 | |
| CN | 103794734 A | 5/2014 | |
| CN | 104143601 A | 11/2014 | |
| CN | 104835920 A | 8/2015 | |

OTHER PUBLICATIONS

Dec. 28, 2018—(CN) Second Office Action Appn 201510299124.9 with English Tran.
Jul. 19, 2017—(CN) Fourth Office Action Appn 201510299124.9 with English Tran.
Feb. 29, 2016—(WO)—International Search Report and Written Opinion Appn PCT/CN2015/090100 with English Tran.
Jul. 12, 2016—(CN)—First Office Action Appn 201510299124.9 with English Tran.
Oct. 25, 2017—(CN) Fifth Office Action Appn 201510299124.9 with English Tran.

\* cited by examiner

_ENCAPSULATION METHOD AND STRUCTURE OF ORGANIC LIGHT EMITTING DIODE_

The application is a U.S. National Phase Entry of International Application No. PCT/CN2015/090100 filed on Sep. 21, 2015, designating the United States of America and claiming priority to Chinese Patent Application No. 201510299124.9, which was filed on Jun. 3, 2015. The present application claims priority to and the benefit of the above-identified applications and the above-identified applications are incorporated by reference herein in their entirety.

TECHNICAL FIELD

Embodiments of the present invention relate to an encapsulation method of an organic light emitting diode (OLED) and an encapsulation structure of an OLED.

BACKGROUND

Organic light emitting diode (OLED) display device has become a very important display technique in flat plate display field due to the advantages such as thin thickness, light weight, wide viewing angle, active light emitting, continuous and adjustable emitting light color, low power consumption, wide working temperature range, simple manufacturing processes, high light emitting efficiency and the ability for flexible display.

The factors affecting the life of an OLED are various, and mainly comprise physical factors and chemical factors. For example, the physical factors comprise the combination of the function layers and the influence between the interfaces thereof, the material of the cathode, the glass transition temperature of the hole transport layer (HTL), the driving method and the like; and for example, the chemical factors comprise the oxidation of cathode, the crystallization of hole transport layer and the like. Theses factors will affect the life of organic electroluminescence device.

Moisture, oxygen or other components in the air largely affect the life of an OLED device in an OLED display device. The cathode of an OLED device generally employs a metal material such as aluminum, magnesium and calcium, whose chemical property is relatively reactive and easy to react with the permeated moisture and oxygen. Besides, the moisture and oxygen will make chemical reactions with the hole transport layer and electron transport layer of an OLED device, and these reactions will cause the invalidation of an OLED device. Therefore, it can largely enlarge the life of an OLED device by sufficiently partitioning the function layers in the OLED device and the moisture and oxygen in the atmosphere, so as to enlarge the serve life of an OLED display device.

An encapsulation method of an OLED display device generally comprises a substrate encapsulation type and a thin film encapsulation type. The substrate encapsulation type fills adhesive film between a display substrate formed with an OLED device and an encapsulation substrate, after the adhesive film being cured, the display substrate and the encapsulation substrate form a closed space therebetween, so as to achieve an encapsulation effect. The thin film encapsulation type covers a thin film encapsulation layer composed of an inorganic thin film and an organic thin film on a surface of an OLED device, so as to make the moisture and oxygen hardly permeate inside the OLED device.

SUMMARY

One embodiment of the present invention provides an encapsulation method of an organic light emitting diode (OLED), comprising: preparing an OLED substrate, the OLED substrate comprising a base substrate and at least one OLED device formed on the base substrate; forming a first encapsulation layer at a side of the OLED substrate formed with the OLED device to cover the OLED device; and forming a second encapsulation layer on the first encapsulation layer, and the second encapsulation layer is a metal layer.

In some examples, the second encapsulation layer is formed through a chemical plating method.

In some examples, the chemical plating comprises at least one selected from the group consisting of chemical silver-plating, chemical copper-plating, chemical nickel-plating and chemical gold-plating.

In some examples, forming the second encapsulation layer comprises sequentially forming a plurality of metal sub-layers.

In some examples, the second encapsulation layer is formed as a two-layer structure comprising two metal sub-layers, in which the metal sub-layer close to the first encapsulation layer is a nickel layer, the metal sub-layer away from the first encapsulation layer is an silver layer; or the second encapsulation layer is formed as a three-layer structure, in which a nickel layer is sandwiched between two silver layers.

In some examples, each of the metal sub-layers has a thickness of 0.15 µm-1 µm.

In some examples, the second encapsulation layer covers an upper surface and a side surface of the first encapsulation layer.

In some examples, the first encapsulation layer is an insulating layer.

In some examples, the first encapsulation layer is an inorganic layer, an organic layer or an inorganic-organic composite layer.

In some examples, the second encapsulation layer has a thickness of 0.15 µm-3 µm.

Another embodiment according to the present invention provides an encapsulation structure of an organic light emitting diode (OLED), comprising: a base substrate; an OLED device formed on the base substrate; and a first encapsulation layer and a second encapsulation layer sequentially covered on the OLED device. The second encapsulation layer is a metal layer.

In some examples, a material of the metal layer is at least one selected from the group consisting of silver, copper, nickel and gold.

In some examples, the second encapsulation layer is a metal layer formed through a chemical plating method.

In some examples, the second encapsulation layer comprises a plurality of metal sub-layers which are sequentially overlapped.

In some examples, the second encapsulation layer is formed as a two-layer structure comprising two metal sub-layers, in which the metal sub-layer close to the first encapsulation layer is a nickel layer, the metal sub-layer away from the first encapsulation layer is an silver layer; or the second encapsulation layer is formed as a three-layer structure, in which a nickel layer is sandwiched between two silver layers.

In some examples, each of the metal sub-layers has a thickness of 0.15 µm-1 µm.

In some examples, the second encapsulation layer covers an upper surface and a side surface of the first encapsulation layer.

In some examples, the first encapsulation layer is an insulating layer.

In some examples, the first encapsulation layer is an inorganic layer, an organic layer or an inorganic-organic composite layer.

In some examples, the second encapsulation layer has a thickness of 0.15 μm-3 μm.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

Figure 1:
FIG. 1 is a structural schematic diagram of a step of an encapsulation method according to the embodiments of the present invention.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

Unless otherwise defined, the technical terminology or scientific terminology used herein should have the same meaning as commonly understood by one of ordinary skill in the art to which this invention belongs. Terms used in the present description and claims such as "first", "second", "third" and so on are only used for distinguishing different components, and cannot be construed as indicating or implying sequence, amount and relative importance. Likewise, a term "a," "an," or "the" does not indicate limitation in number, but specifies the presence of at least one.

The aging of an OLED device is mainly because most organic substance of the light emitting layer is very sensitive to the pollution, oxygen and moisture in the air. The main factors of life reduction of an OLED comprise three aspects. First, the material of the cathode of an OLED is generally a metal with relatively active chemical property, which is extremely easy to be eroded in the air or atmosphere comprising oxygen, and is more likely to cause electrochemical corrosion particularly in an environment comprising moisture. The material of the cathode of an OLED is generally formed through a physical vapor deposition method, micro dust particles are attached on the organic function layer, it is extremely easy to generate pinholes in the cathode material, which become the channels where the moisture, oxygen and the organic function layer contact. Second, the carbonyl compound generated through the oxidation of the light emitting layer and the oxygen is an effective quenching agent, which will notably reduce the light emitting quantum efficiency of the OLED. Third, the heat generated while the OLED is working will further intensify the aging of the light emitting material, assistant material, electrodes and the like in the OLED device, so as to further affect the serve life of the device. In order to make the life of the OLED device achieve the practical requirements, it is generally required that the moisture permeability of the encapsulation of the device is less than $10^{-6}$ g/(m²·d), and the oxygen permeability of the encapsulation of the device is less than $10^{-3}$ g/(m²·d). In the practical work, if the cathode is eroded by 10%, it will seriously affect the work of the device.

The conventional thin film encapsulation comprises an inorganic film encapsulation, an organic film encapsulation, an inorganic-organic film composite encapsulation and the like. However, these thin films cannot avoid thin film defects, and have bad blocking ability to water vapor and oxygen. The embodiments of the present invention provide an encapsulation method of an OLED and an encapsulation structure of an OLED, which utilizes a chemical plating method to plate a metal layer on a thin film layer which is relatively easy to be permeated by moisture and oxygen, so as to improve the blocking ability to moisture and oxygen.

Hereafter, the technical solutions of the present invention will be described in detail in connection with the specific embodiments.

First, preparing an organic light emitting diode (OLED) substrate. As illustrated by FIG. 1, the OLED substrate comprises a base substrate 1 and at least one OLED device 2 disposed on the base substrate 1. The base substrate 1 may be selected as a glass substrate, a plastic substrate or any other suitable substrates, the embodiments according to the present invention are not limited herein. For example, the OLED device 2 may comprise a cathode, an organic light emitting layer and an anode which are disposed in a stacking way. Besides, the OLED device 2 may further comprise an electron injection layer, an electron transport layer, a hole injection layer and a hole transport layer disposed at two sides of the organic light emitting layer. The stacking sequence of the layers may adopt any suitable sequence; the embodiments according to the present invention are not specifically limited herein.

Moreover, except the OLED device 2 itself, the OLED substrate may comprise various kinds of circuits and layer structures used for driving the OLED device 2. For example, a buffer layer, an active layer, a gate insulating layer, a gate electrode layer, an interlayer insulating layer, a source drain metal layer, a passivation layer and a planarization layer may be sequentially formed on the base substrate 1. The gate electrode layer comprises a gate electrode, the source drain metal layer comprises a source electrode and a drain electrode. The source electrode and the drain electrode can be connected with the active layer through via holes going through the interlayer insulating layer and the gate insulating layer. The active layer, the gate insulating layer, the gate electrode, the interlayer insulating layer, the source electrode and the drain electrode constitute a driving thin film transistor (TFT). The passivation layer partitions the driving TFT and the OLED device formed in the following processes. The planarization layer is configured to make the surface of the display substrate flat. It is to be noted that, except the driving TFT, the display substrate further comprises structures such as a switching TFT, a storage capacitor, a gate line and a data line, which are used to drive the OLED device together with the driving TFT, these structures can be same with the existing arts, and the redundant portions are omitted herein.

Furthermore, the OLED substrate may further comprise a pixel defining layer formed on the planarization layer. The pixel defining layer defines a plurality of pixel units.

It is to be noted that, the layers constituting the driving TFT, the passivation layer, the planarization layer, the pixel defining layer and the layers constituting the OLED device can be formed by any known materials and methods for preparing these layers, and the driving TFT and OLED device can employ any known structures in the existing art, and the driving TFT and OLED device can have any known relative position relationships, the embodiments of the present invention are not specifically limited herein. Therefore, the descriptions on these layers are omitted and the elements are not shown in the drawings in detail.

It is to be noted that, the abovementioned OLED substrate is described by taking an OLED display substrate as an example, for example, except the OLED device itself, the abovementioned OLED substrate further comprises various circuits used for driving the OLED device. However, the OLED substrate according to the embodiments of the present invention is not limited to a display substrate, and it may be any substrate comprising an OLED device. Certainly, except the OLED device, the OLED substrate may comprise any other necessary components according to the requirements.

An encapsulation method according to the embodiments of the present invention forms an encapsulation layer at a side of the OLED substrate formed with an OLED device to encapsulate the OLED device. For example, a region covered by the encapsulation layer is larger than a region where the OLED device is located, in this way, the encapsulation layer can completely cover the OLED device and protect the OLED device. For example, the encapsulation layer may comprise a first encapsulation layer and a second encapsulation layer which are sequentially formed. The first encapsulation layer may adopt a conventional inorganic material, organic material or a composition layer of inorganic-organic materials.

Figure 2:
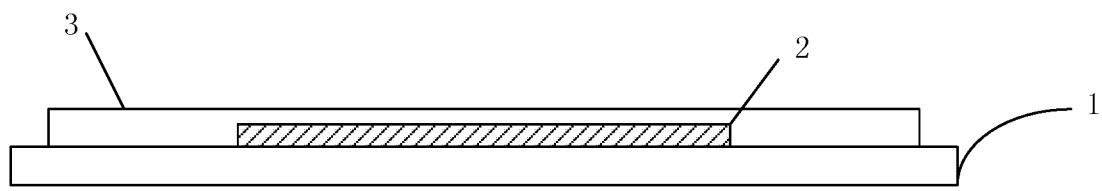
FIG. 2 is another structural schematic diagram of a step of an encapsulation method according to the embodiments of the present invention.

As illustrated by FIG. 2, forming a first encapsulation layer 3 at a side of the OLED substrate with an OLED device being formed on. The first encapsulation layer 3 covers the OLED device 2. For example, a region covered by the first encapsulation layer is larger than a region where the OLED device 2 is located, so as to protect the OLED device 2.

In some examples, the first encapsulation layer may adopt an inorganic material, and the inorganic material is one or a combination of more selected from the group consisting of $Al_2O_3$, $TiO_2$, $ZrO_2$, MgO, $HfO_2$, $Ta_2O_5$, $Si_3N_4$, AlN, SiN, SiNO, SiO, $SiO_2$, $SiO_x$, SiC and ITO.

In some examples, the first encapsulation layer may adopt an organic material, and the organic material is one or a combination of more selected from the group consisting of PET (polyethylene terephthalate), PEN (polyethylene naphthalate), PC (polycarbonate), PI (polyimide), PVC (polyvinyl chloride), PS (polystyrene), PMMA (polymethyl methacrylate), PBT (polybutylene terephthalate), PSO (polysulfone), PES (poly styrene diethyl sulfone), PE (polyethylene), PP (polypropylene), silicone, PA (polyamide), PVDF (polyvinylidene fluoride), EVA (ethylene-vinyl acetate copolymer), EVAL (ethylene-vinyl alcohol), PAN (polyacrylonitrile), PVAc (polyvinyl acetate), Parylene, Polyurea, PTFE (polytetrafluoroethylene) and epoxy resin.

In some examples, the first encapsulation layer is a combination of one or more selected from the abovementioned inorganic materials and one or more selected from the abovementioned organic materials.

The method for forming the first encapsulation layer can be selected as a proper method according to the used material, for example, a deposition method, a spin-coating method can be adopted.

Figure 3:
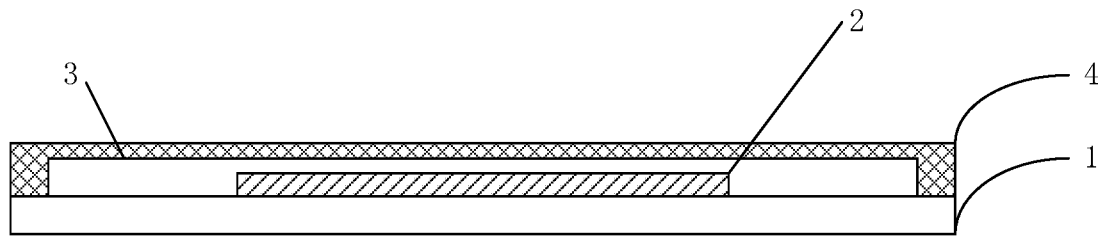
FIG. 3 is a schematic diagram of an encapsulation structure according to an embodiment of the present invention.

As illustrated by FIG. 3, after forming the first encapsulation layer 3, utilizing a chemical silver-plating method to form a silver plating layer, i.e., an silver metal layer. The silver layer forms a second encapsulation layer 4.

Hereafter, the method for forming the second encapsulation layer will be described with a specific example.

In an embodiment according to the present invention, the second encapsulation layer is formed through a chemical silver-plating method. A case where the second encapsulation layer is formed through a chemical silver-plating method will be described as an example herein.

Chemical plating refers to a surface treatment method in which metal ions in a solution are reduced to metal and deposited on a surface of a base body by utilizing a chemical method without the function of foreign current. Chemical plating is an autocatalytic controllable chemical reduction process, i.e., the reduction reaction only can run under the catalytic action of the surface of the base body. The solution stability of chemical silver is relatively bad, thus, the main salt solution and the reduction agent solution are separately prepared, and mixed until plating.

Before silver-plating, firstly performing a pretreatment to a surface to be plated, which comprises three steps: coarsening, sensitizing and activating, so as to improve the bonding force of the plating layer.

For example, in one example, the solution required by the chemical silver-plating method comprises 10 g/L silver nitrate, 5 ml/L ammonium hydroxide, 10 g/L hydrazine sulfate and 5 g/L sodium hydroxide.

In one example, the preparation of the silver salt solution may adopt the following steps: firstly dissolving silver nitrate in distilled water, after the silver nitrate is completely dissolved, slowly adding concentrated ammonia water while stirring, starting to generate brown precipitation of silver hydroxide. The chemical reaction generated in this stage can be represented by the following reaction formula:

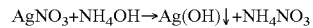

$$AgNO_3 + NH_4OH \rightarrow Ag(OH)\downarrow + NH_4NO_3$$

Afterwards, the brown silver hydroxide quickly decomposes into black brown silver oxide. The chemical reaction generated in this stage can be represented by the following reaction formula:

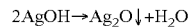

$$2AgOH \rightarrow Ag_2O\downarrow + H_2O$$

Upon continuing to add superfluous ammonium hydroxide, the $Ag_2O$ is dissolved by ammonium hydroxide to form a colorless and transparent silver ammonia complex solution. The chemical reaction generated in this stage can be represented by the following reaction formula:

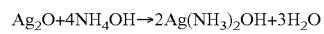

$$Ag_2O + 4NH_4OH \rightarrow 2Ag(NH_3)_2OH + 3H_2O$$

In one example, the preparation of the reduction agent solution can adopt the following steps: adding reduction agent hydrazine sulfate in distilled water, and adding an assistant agent sodium hydroxide (accelerating the silver-plating speed).

Two kinds of solutions (i.e., an silver salt solution and a reduction agent solution) are mixed before using. Utilizing a spraying method to plate silver, and silver ammonia complex ions react with and are reduced by the reduction agent to silver which is deposited on the base body material.

The chemical reaction generated in this stage can be represented by the following reaction formula:

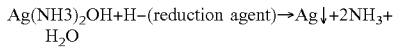

As seen, the reduced silver is deposited on the base body material to form a compact silver metal layer. The silver metal layer can prevent moisture and oxygen permeating in the first encapsulation layer and the OLED device.

The foregoing illustrates the chemical silver-plating method according to a specific example. However, the chemical silver-plating method according to the embodiments of the present invention is not limited to the above specific steps, solutions and the like, but can adopt any suitable chemical silver-plating method to form the second encapsulation layer-silver metal layer according to the embodiments of the present invention.

In the abovementioned method, a spraying method is adopted to conduct plating on a surface which has to be formed with an encapsulation layer, thus, the surface of the other side of the substrate will not be formed with a silver plating layer. However, other method can be adopted to conduct the abovementioned plating process. For example, a protection layer may be firstly formed on the surface which is not necessary to be plated, and the protection layer is removed after conducting the plating process.

Chemical plating technology does not require extreme means such as high temperature high pressure, thus does not cause damage to the OLED device or other unnecessary components formed on the OLED substrate, and can be compatible with the processes of the OLED substrate. Besides, the OLED substrate according to the embodiments of the present invention firstly forms a first encapsulation layer before forming the second encapsulation layer, and the first encapsulation layer can protect the encapsulated OLED device or other components well during the technological processes of the second encapsulation layer. Besides, the first encapsulation layer is an insulating material, so as to prevent silver metal layer causing damage to the other conductive circuits.

For example, the second encapsulation layer has a thickness of 0.15 μm-3 μm, in one example, the thickness may be 0.5 μm-2.5 μm, in another example, the thickness may be 1 μm-2 μm.

In some examples, the second encapsulation layer completely covers an upper surface and a side surface of the first encapsulation layer. For example, the upper surface herein refers to a surface of a side of the first encapsulation layer 3 opposite to the OLED device 2, and the side surface refers to an end surface of the first encapsulation layer 3 in the plane direction. In this case, the silver metal at the side surface of the first encapsulation layer 3 can prevent moisture and oxygen permeating from a side surface of the first encapsulation layer 3 and an interface of the first encapsulation layer 3 and the lower layer into the OLED device.

In some examples, the base substrate of the OLED substrate is a transparent substrate. In this case, the second encapsulation layer may serve as a reflective layer, in this way, the light emitted from the OLED device can exit from the side of the base substrate.

In the abovementioned embodiments, a case where the second encapsulation layer is formed through a chemical silver-plating method is described as an example. However, the embodiments according to the present invention are not limited to the chemical silver-plating, and can also adopt chemical plating to form other metal layer to form the second encapsulation layer, or can also adopt other methods of low temperature for forming a metal layer to form the second encapsulation layer. For example, at least one selected from the group consisting of chemical silver-plating, chemical copper-plating, chemical nickel-plating and chemical gold-plating can be adopted. In some examples, the abovementioned method can be adopted to form a plurality of metal sub-layers. Besides, the thickness, position and structure of the metal layer formed through these methods also can use the thickness, position and structure described in the embodiment of using chemical silver-plating.

Figure 4:
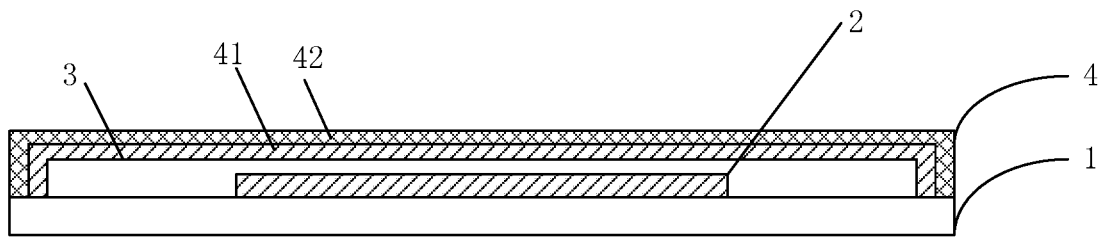
FIG. 4 is a schematic diagram of an encapsulation structure according to another embodiment of the present invention.

In some examples, as illustrated by FIG. 4, the second encapsulation layer 4 is formed as a two-layer structure comprising two metal sub-layers, in which the metal sub-layer 41 close to the first encapsulation layer is a nickel layer, the metal sub-layer 42 away from the first encapsulation layer is a silver layer. In another example, the second encapsulation layer 4 is formed as a three-layer structure comprising three metal sub-layers, in which a nickel layer is sandwiched between two silver layers. For example, FIG. 4 can be referred to for this structure, and another silver layer is inserted between the nickel layer 41 and the first encapsulation layer. For example, each of the metal sub-layers has a thickness of 0.15 μm-1 μm. In these structures, the silver layer located at the outer side can protect the nickel layer.

In the encapsulation method of an OLED according to the embodiments of the present invention, a chemical plated metal layer is formed on the first encapsulation layer. The metal layer can be evenly deposited on the surface of the first encapsulation layer, and it is not easy to generate thin film defect, and can repair the thin film defect of the first encapsulation layer. Therefore, the metal layer can basically completely prevent the permeation of moisture and oxygen, and can largely improve the encapsulation effect of an OLED. In the abovementioned encapsulation method of an OLED, the metal plating layer can cover the upper surface and side surface of the first encapsulation layer, and thus can better improve the encapsulation effect. Besides, the metal plating layer formed in the encapsulation method of an OLED can further play a role of a reflective layer, so as to make the optical energy emitted from the OLED device be able to emit from the transparent base substrate.

Besides, some other embodiments according to the present invention further provide an encapsulation structure of an OLED. As illustrated by FIG. 3, the encapsulation structure of an OLED comprises a base substrate 1, an OLED device 2 formed on the base substrate 1 and a first encapsulation layer 3 and a second encapsulation layer 4 sequentially covered on the OLED device. The second encapsulation layer 4 is a metal layer, for example, the metal layer is formed through a chemical plating (chemical silver-plating) method. For example, the material of the metal layer may be at least one selected from the group consisting of silver, copper, nickel and gold.

In some examples, the second encapsulation layer 4 comprises a plurality of metal sub-layers which are sequentially stacked. For example, the second encapsulation layer 4 is a two-layer structure comprising two metal sub-layers, in which the metal sub-layer close to the first encapsulation layer is a nickel layer 41, the metal sub-layer away from the first encapsulation layer is a silver layer 42. In some other examples, the second encapsulation layer 3 is a three-layer structure comprising three metal sub-layers, in which a nickel layer is sandwiched between two silver layers. For example, the structure may refer to FIG. 4, the nickel layer 41 and the first encapsulation layer may further comprise another silver layer therebetween. For example, each of the metal sub-layers has a thickness of 0.15 μm-1 μm. In these structures, the silver layer located at the outer side can protect the nickel layer.

With regard to the OLED substrate, except the base substrate 1 and the OLED device 2 formed thereon, the OLED substrate may comprise other necessary components. The structure of the OLED substrate may refer to the description of the abovementioned embodiments, and the redundant portions are omitted herein.

For example, the material of the first encapsulation layer may adopt the materials described in the abovementioned embodiments, and the relating descriptions are omitted herein.

For example, the thickness of the second encapsulation layer 4 may be 0.15 μm-3 μm, in an example, the thickness may be 0.5 μm-2.5 μm, in another example, the thickness may be 1 μm-2 μm.

For example, the first encapsulation layer 3 and the base substrate 1 can completely encapsulate the OLED device 2. For example, a region covered by the first encapsulation layer is larger than a region where the OLED device 2 is located, so as to protect the OLED device 2.

For example, the second encapsulation layer 4 covers the upper surface and the side surface of the first encapsulation layer 3.

For example, the base substrate 1 is a transparent base substrate, for example, the base substrate 1 may be a glass substrate, a plastic substrate or any other suitable substrate.

Besides, the encapsulation structure according to the embodiments of the present invention may comprise different kinds of structural features described in the embodiments of the abovementioned encapsulation method of the abovementioned OLED, and the relating descriptions are omitted herein.

In the encapsulation structure of an OLED according to the embodiments of the present invention, a chemical plated metal layer is formed on the first encapsulation layer. The metal layer can be evenly deposited on the surface of the first encapsulation layer, and it is not easy to generate thin film defect, and can repair the thin film defect of the first encapsulation layer. Therefore, the metal layer can basically completely prevent the permeation of moisture and oxygen, and can largely improve the encapsulation effect of an OLED. In the abovementioned encapsulation method of an OLED, the metal plating layer can cover the upper surface and side surface of the first encapsulation layer, and thus can better improve the encapsulation effect. Besides, the metal plating layer formed in the encapsulation method of an OLED can further play a role of a reflective layer, so as to make the optical energy emitted from the OLED device be able to emit from the transparent base substrate.

The foregoing are merely specific embodiments of the invention, but not limitative to the protection scope of the present disclosure. Therefore, the protection scope of the invention should be defined by the accompanying claims.

The present disclosure claims the benefits of Chinese patent application No. 201510299124.9, which was filed on Jun. 3, 2015 and is fully incorporated herein by reference as part of this application.

The invention claimed is:

1. An encapsulation method of an organic light emitting diode (OLED), comprising:
    preparing an OLED substrate, the OLED substrate comprising a base substrate and at least one OLED device formed on the base substrate;
    forming a first encapsulation layer at a side of the OLED substrate with the OLED device being formed on to cover the OLED device; and
    forming a second encapsulation layer on the first encapsulation layer, the second encapsulation layer being a metal layer,
    wherein the second encapsulation layer is formed through a chemical plating method,
    the forming the second encapsulation layer comprises forming a plurality of metal sub-layers,
    the second encapsulation layer is a two-layer structure comprising two metal sub-layers, in which a metal sub-layer close to the first encapsulation layer is a nickel layer, a metal sub-layer away from the first encapsulation layer is a silver layer; or the second encapsulation layer is a three-layer structure comprising three metal sub-layers, in which a nickel layer is sandwiched between two silver layers,
    before forming the second encapsulation layer through the chemical plating method, forming a protection layer on a region of the OLED substrate which is not necessary to be plated, after forming the second encapsulation layer through the chemical plating method, removing the protection layer,
    the first encapsulation layer is covered on an upper surface and a side surface of the OLED device, the upper surface of the OLED device is a surface of a side of the OLED device opposite to OLED substrate, and the side surface of the OLED device is an end surface of the OLED device in the plane direction, and
    the second encapsulation layer is covered on an upper surface and a side surface of the first encapsulation layer, the upper surface of the first encapsulation layer is a surface of a side of the first encapsulation layer opposite to the OLED device, and the side surface of the first encapsulation layer is an end surface of the first encapsulation layer in the plane direction.

2. The method according to claim 1, wherein the chemical plating method comprises at least one selected from the group consisting of chemical silver-plating, chemical copper-plating, chemical nickel-plating and chemical gold-plating.

3. The method according to claim 1, wherein each of the metal sub-layers has a thickness of 0.15 μm-1 μm.

4. The method according to claim 1, wherein the first encapsulation layer is an insulating layer.

5. The method according to claim 4, wherein the first encapsulation layer is an inorganic layer, an organic layer or an inorganic-organic composite layer.

6. The method according to claim 1, wherein the second encapsulation layer has a thickness of 0.15 μm-3 μm.

* * * * *